United States Patent
Kwon (10) Patent No.: US 9,437,819 B2
(45) Date of Patent: Sep. 6, 2016

(54) DONOR SUBSTRATE AND METHOD FOR FORMING TRANSFER PATTERN USING THE SAME

(71) Applicant: SAMSUNG DISPLAY CO., LTD., Yongin, Gyeonggi-Do (KR)

(72) Inventor: YoungGil Kwon, Suwon-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/791,635

(22) Filed: Jul. 6, 2015

(65) Prior Publication Data

US 2016/0020398 A1 Jan. 21, 2016

Related U.S. Application Data (63) Continuation of application No. 14/036,648, filed on Sep. 25, 2013, now Pat. No. 9,099,651.

(30) Foreign Application Priority Data

May 28, 2013 (KR) ........................ 10-2013-0060490

(51) Int. Cl.
| | | |
|---|---|---|
| *H01L 21/00* | (2006.01) | |
| *H01L 51/00* | (2006.01) | |
| *H01L 51/56* | (2006.01) | |

(Continued)

(52) U.S. Cl.
CPC ............ *H01L 51/0013* (2013.01); *B41M 5/42* (2013.01); *B41M 5/44* (2013.01); *B41M 5/446* (2013.01); *B41M 5/46* (2013.01); *B41M 5/465* (2013.01); *H01L 27/32* (2013.01); *H01L 51/56* (2013.01); *B41M 2205/02* (2013.01); *B41M 2205/30* (2013.01); *B41M 2205/38* (2013.01); *H01L 51/5012* (2013.01); *H01L 51/5056* (2013.01);

(Continued)

(58) Field of Classification Search
CPC ........... H01L 51/0014; H01L 51/0002; H01L 51/0021
USPC .......................................................... 438/24
See application file for complete search history.

(56) References Cited

U.S. PATENT DOCUMENTS 5,937,272 A * 8/1999 Tang .................... H01L 27/3211
438/158

(Continued)

FOREIGN PATENT DOCUMENTS

| | | |
|---|---|---|
| JP | 2002-343565 | 11/2002 |
| KR | 1020030048039 | 6/2003 |

(Continued)

OTHER PUBLICATIONS

T. Dikic et al., "Self-Replenshing Services", Advanced Materials, 2012, 24, pp. 3701-3704.

*Primary Examiner* — Caridad Everhart
(74) *Attorney, Agent, or Firm* — F. Chau & Associates, LLC (57) ABSTRACT

A donor substrate includes a base layer, a light-to-heat conversion layer disposed on the base layer, a buffer layer disposed on the light-to-heat conversion layer and a transfer layer disposed on the buffer layer. The buffer layer includes a cross-linked polymer, a spacer polymer bonded to the cross-linked polymer, and a perfluoroalkyl alcohol group bonded to the spacer polymer.

18 Claims, 5 Drawing Sheets

(51) Int. Cl.
  *B41M 5/42* (2006.01)
  *B41M 5/44* (2006.01)
  *B41M 5/46* (2006.01)
  *H01L 27/32* (2006.01)
  *H01L 51/50* (2006.01)

(52) U.S. Cl.
  CPC ........ *H01L 51/5072* (2013.01); *H01L 51/5088* (2013.01); *H01L 51/5092* (2013.01)

(56) References Cited

U.S. PATENT DOCUMENTS

| | | | |
|---|---|---|---|
| 6,027,850 A * | 2/2000 | Kawakami | B41J 2/4753 271/196 |
| 6,214,520 B1 | 4/2001 | Wolk et al. | |
| 6,855,384 B1 | 2/2005 | Nirmal et al. | |
| 2003/0008224 A1 | 1/2003 | Fujita et al. | |
| 2003/0054142 A1* | 3/2003 | Yamamoto | B41M 5/345 428/195.1 |
| 2005/0029934 A1* | 2/2005 | Blanchet-Fincher | B41M 5/38207 313/504 |
| 2005/0287315 A1* | 12/2005 | Kreilich | B41M 3/003 428/32.81 |

FOREIGN PATENT DOCUMENTS

| | | | |
|---|---|---|---|
| WO | 2006137726 | 12/2006 | ............ C08G 18/46 |
| WO | WO2006/137725 A2 * | 12/2006 | ............ C09D 167/02 |

* cited by examiner

DONOR SUBSTRATE AND METHOD FOR FORMING TRANSFER PATTERN USING THE SAME

CROSS-REFERENCE TO RELATED APPLICATIONS

This application is a continuation of U.S. application Ser. No. 14/036,648 filed on Sep. 25, 2013, which claims priority under 35 U.S.C. §119 to Korean Patent Application No. 10-2013-0060490, filed on May 28, 2013, the entire disclosure of which is hereby incorporated by reference herein in its entirety.

(i) TECHNICAL FIELD

The present disclosure herein relates to a donor substrate and a method for forming a transfer pattern using the same, and more particularly, to a donor substrate including a buffer layer having hydrophobic properties and a method for forming a transfer pattern using the same.

(ii) DISCUSSION OF THE RELATED ART

A laser induced thermal imaging method is used as a method for forming organic/inorganic patterns (hereinafter, will be referred to as transfer patterns) on a transcription substrate. For example, the laser induced thermal imaging method is used in a forming process of an organic light emitting device.

A donor substrate is used in the laser induced thermal imaging method. The donor substrate includes a light-to-heat conversion layer for transforming incident light from a light source into heat, a buffer layer disposed on the light-to-heat conversion layer and a transfer layer disposed on the buffer layer.

The buffer layer may have a greater bonding force with the light-to-heat conversion layer than the transfer layer. The buffer layer is hydrophobic. The hydrophobic buffer layer may induce only the transcription of the transfer layer from the donor substrate. For example, when the buffer layer is omitted, a portion of the light-to-heat conversion layer may be attached to the transfer layer to be transferred to the substrate for transcription.

SUMMARY

Accordingly, the present disclosure provides a donor substrate including a buffer layer keeping hydrophobic properties in spite of physical damages.

The present disclosure also provides a method for forming a transfer pattern by using the donor substrate.

Embodiments of the inventive concept provide a donor substrate including a base layer, a light-to-heat conversion layer, a buffer layer and a transfer layer. The light-to-heat conversion layer is disposed on the base layer. The buffer layer is disposed on the light-to-heat conversion layer. The buffer layer includes a cross-linked polymer, a spacer polymer bonded to the cross-linked polymer, and a perfluoroalkyl alcohol group bonded to the spacer polymer. The transfer layer is disposed on the buffer layer.

In embodiments, the spacer polymer may include a polycaprolactone group. The buffer layer may include the perfluoroalkyl alcohol group bonded to the spacer polymer, and a number of carbon atoms making a bond with fluorine in the perfluoroalkyl alcohol group may be 3 to 20.

In embodiments of the inventive concept, a method for forming a transfer pattern includes disposing a donor substrate including a base layer, a light-to-heat conversion layer disposed on the base layer, a buffer layer disposed on the light-to-heat conversion layer and including a cross-linked polymer, a spacer polymer bonded to the cross-linked polymer, and a perfluoroalkyl alcohol group bonded to the spacer polymer, and a transfer layer disposed on the buffer layer, on a transcription substrate to make a contact between a transfer layer and the transcription substrate, exposing the donor substrate to transfer the transfer pattern onto the transcription substrate, and removing the donor substrate from the transcription substrate. The donor substrate may be one of above-described donor substrates.

In accordance with an example embodiment, a method for forming a transfer pattern on an organic light emitting display substrate is provided. The method includes disposing a donor substrate including a base layer, a light-to-heat conversion layer disposed on the base layer, a buffer layer disposed on the light-to-heat conversion layer and including a cross-linked polymer, a spacer polymer bonded to the cross-linked polymer, and a perfluoroalkyl alcohol group bonded to the spacer polymer, and a transfer layer disposed on the buffer layer, on a base substrate of the organic light emitting display substrate to make a contact between the transfer layer and the base substrate, and exposing the donor substrate to light to transfer the transfer pattern onto the base substrate. The organic light emitting display substrate includes an organic light emitting device, and the transfer pattern constitutes at least a portion of the organic light emitting device and includes at least one of a hole transporting layer, an organic light emitting layer, a hole injection layer and an electron injection layer.

In addition, the method further includes removing the donor substrate from the base substrate after forming the transfer pattern.

As described above, the buffer layer keeps the hydrophobic properties through self-replenishing. The physically damaged portion of the buffer layer may include a newly exposed partial surface. A perfluoroalkyl alcohol group included in the partial surface may be activated by a spacer polymer to keep the hydrophobic properties even in the damaged portion.

Even though the buffer layer is physically damaged, the transfer layer may be disposed on the hydrophobic surface of the buffer layer. Accordingly, the separation of the buffer layer from the transfer layer may be generated relatively easily, and a partial transfer of the buffer layer may not be generated.

BRIEF DESCRIPTION OF THE DRAWINGS

Example embodiments of the inventive concept can be understood in more detail from the following detailed description taken in conjunction with the accompanying drawings in which.

DETAILED DESCRIPTION OF EXAMPLE EMBODIMENTS

Hereinafter, an organic light emitting display apparatus in accordance with example embodiments of the inventive concept will be described in detail with reference to the accompanying drawings.

In the drawings, the dimensions of layers and regions may be exaggerated for clarity of illustration. Like reference numerals refer to like elements throughout. It will also be understood that when a layer is referred to as being 'on' another layer or substrate, it can be directly on the other layer or substrate, or intervening layers may also be present. Further, when one side of a layer is illustrated as planar in the drawings, the side is not necessarily planar however, but rather a step may be formed at the surface of an upper layer due to the surface shape of a lower layer in a stacking process. In addition, the term of 'line' herein below means a signal line formed by using a conductive material.

Figure 1:
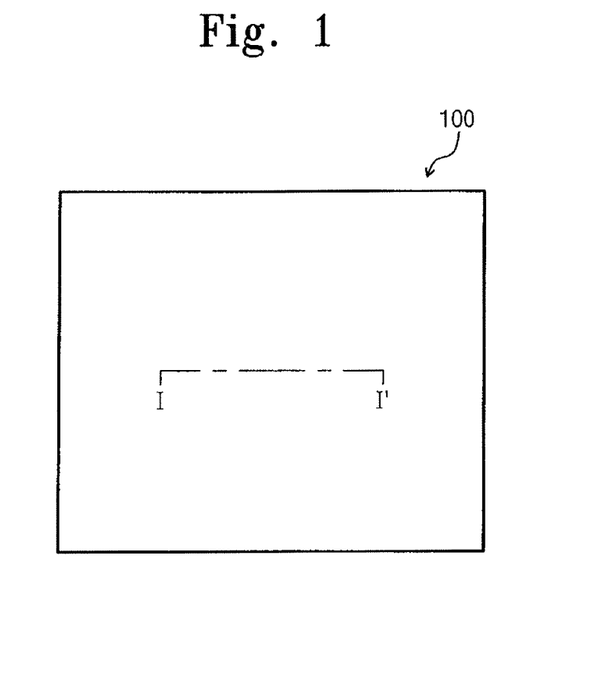
FIG. 1 is a plan view of a donor substrate in accordance with an example embodiment of the inventive concept.
Figure 2:
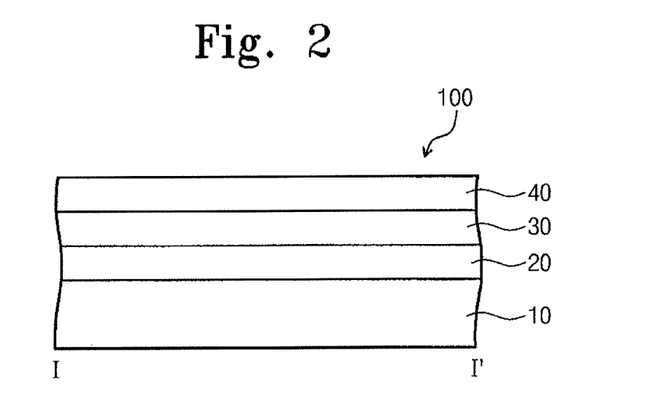
FIG. 2 is a cross-sectional view taken along I-I' in FIG. 1.

FIG. 1 is a plan view of a donor substrate in accordance with an example embodiment of the inventive concept, and FIG. 2 is a cross-sectional view taken along I-I' in FIG. 1. Hereinafter, the donor substrate according to example embodiments will be explained referring to FIGS. 1 and 2.

As illustrated in FIGS. 1 and 2, a donor substrate 100 includes, for example, a base layer 10, a light-to-heat conversion layer 20, a buffer layer 30 and a transfer layer 40. Even though not illustrated, another functional layer may be disposed between the base layer 10 and the light-to-heat conversion layer 20.

The base layer 10 is transparent for the transmission of incident light. The base layer 10 may include at least one polymer material selected from the group consisting of, for example, polyester, polyacryl, polyepoxy, polyethylene, polystyrene, polyethylene terephthalate, polyethersulfone, polyethylenenaphthalate, polyimide, polyvinyl chloride, or combinations thereof. The base layer 10 may be a polymer film formed by, for example, using the polymer material, or may be formed by using glass, quartz, or the like. The thickness of the base layer 10 may be, for example, from about 10 μm to about 500 μm.

The light-to-heat conversion layer 20 is disposed on the base layer 10. The light-to-heat conversion layer 20 absorbs the incident light and transforms the absorbed light into heat. The light-to-heat conversion layer 20 may absorb the incident light having a certain wavelength region such as, for example, an infrared light region or a visible light region.

The light-to-heat conversion layer 20 may include, for example, a material having a certain optical density and light absorbing properties. For example, the light-to-heat conversion layer 20 may include a metal such as aluminum (Al), nickel (Ni), molybdenum (Mo), titanium (Ti), zirconium (Zr), copper (Cu), vanadium (V), tantalum (Ta), palladium (Pd), ruthenium (Ru), iridium (Ir), gold (Au), silver (Ag), platinum (Pt), magnesium (Mg), neodymium (Nd), calcium (Ca), tungsten (W), zinc (Zn), cobalt (Co), manganese (Mn), rhodium (Rh), osmium (Os), and the like, a metal oxide thereof, a metal sulfide thereof, a polymer including carbon black, graphite, an infrared dye, a visible dye, an ultraviolet dye, a fluorescent dye, or a radiation-polarizing dye as a light absorbing material. These materials may be used alone or as a combination thereof. In addition, the light-to-heat conversion layer 20 may have a single layer structure or a multi-layer structure including, for example, the above-described materials.

The light-to-heat conversion layer 20 may further include, for example, a binder. For example, the light-to-heat conversion layer 20 may be an organic layer in which carbon black is dispersed in an organic binder, or a metal layer including a metal oxide or a metal sulfide.

The buffer layer 30 may be disposed on the light-to-heat conversion layer 20. The buffer layer 30 may prevent the contamination of the transfer layer 40 from the light absorbing material such as, for example, carbon black included in the light-to-heat conversion layer 20.

The transfer layer 40 is disposed on the buffer layer 30. The transfer layer 40 includes, for example, an organic material that may be transferred after getting a supply of a thermal energy. For example, the transfer layer 40 may include an organic material constituting a color filter, and a functional material constituting an organic light emitting device, as an organic material evaporated by the supply of the thermal energy. However, the transfer layer 40 is not limited to the above-mentioned materials.

Figure 3:
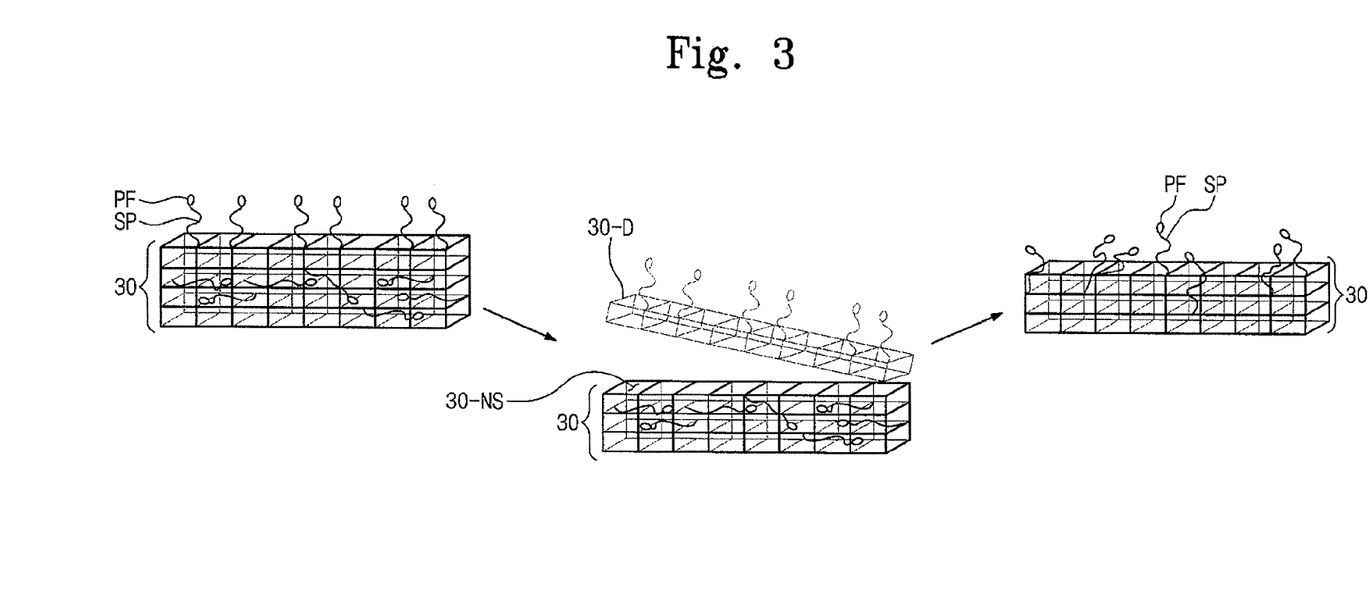
FIG. 3 illustrates a self-replenishing process of a portion of a physically damaged buffer layer.

FIG. 3 illustrates a self-replenishing process of a portion of a physically damaged buffer layer. Hereinafter, the buffer layer will be explained in more detail referring to FIG. 3.

The buffer layer 30 includes, for example, a cross-linked polymer and a spacer polymer (SP) bonded to the cross-linked polymer, and a perfluoroalkyl alcohol group (PF) bonded to the spacer polymer (SP). The perfluoroalkyl alcohol group (PF) covalently bonds with the cross-linked polymer by means of the spacer polymer (SP). The cross-linked polymer makes a base of the buffer layer 30. The perfluoroalkyl alcohol group (PF) is a dangling chain of the buffer layer 30, and the spacer polymer (SP) increases the mobility of the dangling chain.

The buffer layer 30 is hydrophobic due to the perfluoroalkyl alcohol group (PF). The perfluoroalkyl alcohol group (PF) is activated at the surface of the buffer layer 30 by the spacer polymer (SP). When the surface of the buffer layer 30 is physically damaged such as, for example, when a portion of the surface 30-D of the buffer layer 30 is separated or scratched, the damaged portion may have a newly exposed partial surface 30-NS. The damaged portion also keeps the hydrophobic properties because the perfluoroalkyl alcohol group (PF) included in the partial surface 30-NS is activated by the spacer polymer (SP).

In the buffer layer of a conventional donor substrate, fluorine is present only on the surface of the buffer layer. When a portion of the surface of the buffer layer is physically damaged such as, for example, when about 20 nm from the surface of the buffer layer is removed, the damaged portion of the buffer layer may in turn lose its hydrophobic properties. However, as described above, the buffer layer 30 of the donor substrate 100 in accordance with the present example embodiment may be self-replenished, and the transfer layer 40 is disposed on the buffer layer 30 keeping the hydrophobic surface. Thus, the separation between the buffer layer 30 and the transfer layer 40 may be relatively easily generated, and defects of a partial transferring of the buffer layer 30 may not be generated.

The perfluoroalkyl alcohol group (PF) bonded to the spacer polymer (SP) may be represented by, for example, the following Chemical Formula 1.

[Chemical Formula 1]

As represented by following Chemical Formula 2, the spacer polymer (SP) may be, for example, a polycaprolactone group. In the following Chemical Formula 2, "y" may be, for example, 1 to 10.

[Chemical Formula 2]

In an embodiment, the buffer layer 30 includes, for example, a perfluoroalkyl alcohol group (PF) bonded to the polycaprolactone group. The perfluoroalkyl alcohol group (PF) bonded to the polycaprolactone group may be, for example, 2-(perfluorooctyl) ethanol represented by the following Chemical Formula 3.

[Chemical Formula 3]

In an example embodiment of the inventive concept, the perfluoroalkyl alcohol group may include, for example, 3 to 20 carbon atoms bonded with fluorine.

Figure 4A:
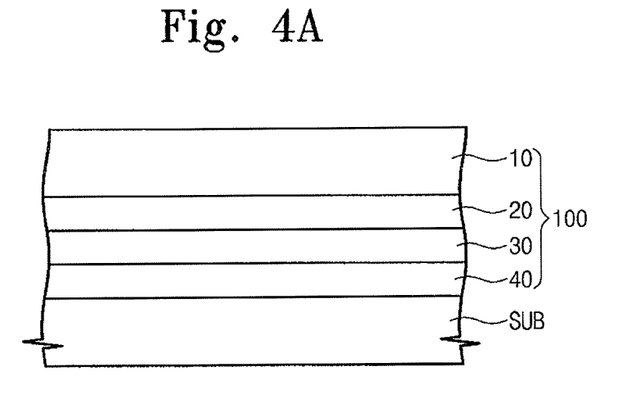
FIGS. 4A to 4C are cross-sectional views illustrating a process for forming a transfer pattern in accordance with an example embodiment of the inventive concept.
Figure 4B:
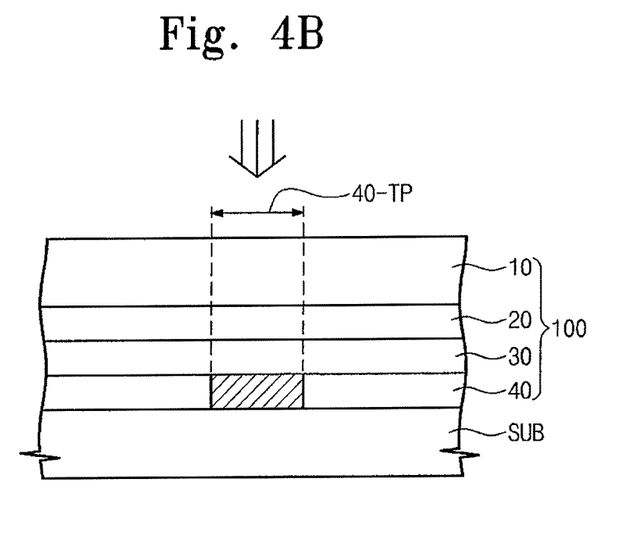
Figure 4C:
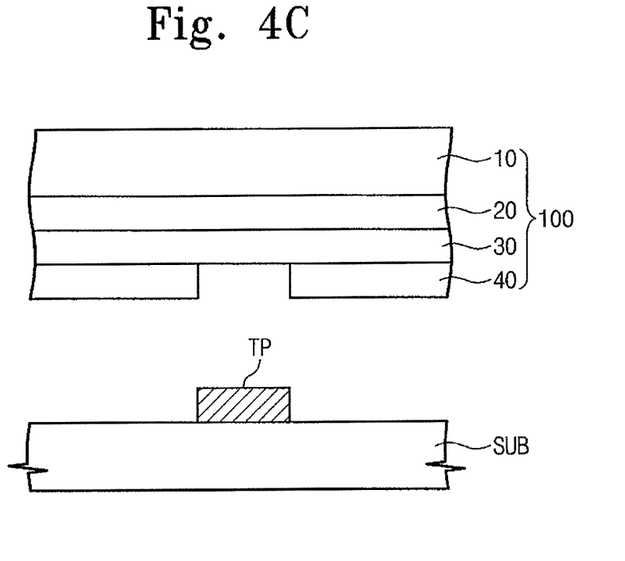

FIGS. 4A to 4C are cross-sectional views illustrating a process for forming a transfer pattern in accordance with an example embodiment of the inventive concept. Hereinafter, a method for forming a transfer pattern will be explained referring to FIGS. 4A to 4C.

For example, first, as illustrated in FIG. 4A, a donor substrate 100 is disposed on a transcription substrate SUB so that a transfer layer 40 makes a contact with the transcription substrate SUB. The donor substrate 100 may be the donor substrate explained referring to FIGS. 1 to 3. The transcription substrate SUB may further include, for example, an insulating layer even though not illustrated. The insulating layer may include, for example, an organic layer and/or an inorganic layer. As described hereinafter, the transcription substrate SUB may constitute a portion of an organic light emitting display substrate.

As illustrated in FIG. 4B, the donor substrate 100 is, for example, exposed to a light. The light may include, for example, an ultraviolet light or a visible light. In addition, the light may be, for example, a laser beam having a constant wavelength.

To transfer a portion of the transfer layer 40, a portion of the donor substrate 100 may, for example, be exposed to the light. A light source providing the light to a portion of the donor substrate 100 may be used in this step. In an embodiment, a light source providing the light to, for example, the whole donor substrate 100, and a mask including an opening portion partially transmitting the provided light from the light source may be used in this step. Additionally, for example, the whole donor substrate 100 may be exposed to the light to transfer the whole transfer layer 40.

Then, as illustrated in FIG. 4C, a transfer pattern TP corresponding to the light incident portion of the donor substrate 100, is, for example, formed on the transcription substrate SUB. After forming the transfer pattern TP, the donor substrate 100 may be removed from the transcription substrate SUB.

Figure 5:
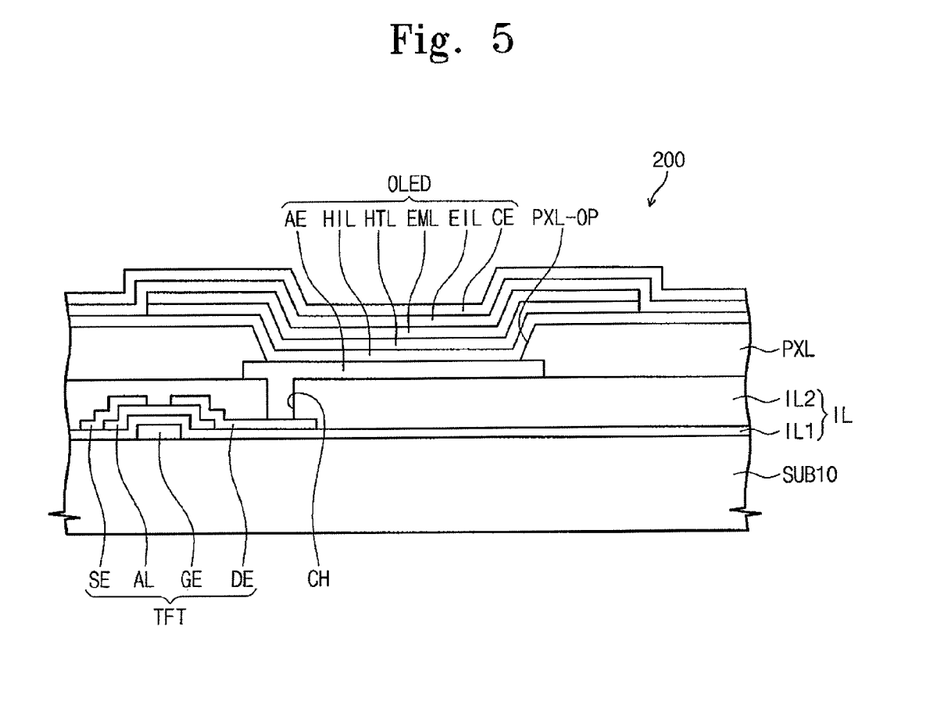
FIG. 5 is a cross-sectional view of an organic light emitting display substrate including a transfer pattern formed in accordance with an example embodiment of the inventive concept.

FIG. 5 is a cross-sectional view of an organic light emitting display substrate 200 including a transfer pattern formed in accordance with an example embodiment of the inventive concept. The organic light emitting display substrate 200 includes, for example, a base substrate SUB10, a thin film transistor TFT disposed on the base substrate SUB10, insulating layers IL, and an organic light emitting device OLED. The thin film transistor TFT and the organic light emitting device OLED are, for example, disposed for each pixel provided on the organic light emitting display substrate 200. The pixels may be arranged, for example, in a matrix shape on the base substrate SUB10. Even though not separately illustrated, the organic light emitting display substrate 200 may further include, for example, a plurality of lines for providing electric signals to the pixels.

As illustrated in FIG. 5, a control electrode GE of the thin film transistor TFT is disposed on the base substrate SUB10. The base substrate SUB10 corresponds to the transcription substrate SUB explained referring to FIGS. 4A to 4C.

For example, on the base substrate SUB10, a first insulating layer IL1 covering the control electrode GE is disposed. A semiconductor layer AL is disposed on the first insulating layer IL1. An input electrode SE and an output electrode DE are disposed, for example, on the first insulating layer IL1 so as to be overlapped with the semiconductor layer AL.

A second insulating layer IL2 covers the input electrode SE and the output electrode DE. On the second insulating layer IL2, the organic light emitting device OLED is disposed. The organic light emitting device OLED includes, for example, a first electrode AE, a hole injection layer HIL, a hole transporting layer HTL, an organic light emitting layer EML, an electron injection layer EIL, a second electrode CE stacked one by one on the second insulating layer IL2. The first electrode AE is connected through a contact hole CH penetrating the second insulating layer IL2 to the output electrode DE.

Meanwhile, the structure of the organic light emitting device OLED in accordance with example embodiments is not limited to the above-described structure. For example, alternatively, in an embodiment, the electron injection layer EIL may be omitted, and the organic light emitting device OLED may further include an electron transporting layer between the organic light emitting layer EML and the electron injection layer EIL.

Different from the common disposition of the hole injection layer HIL and the electron injection layer EIL between the pixels, the hole transporting layer HTL and the organic light emitting layer EML are independently disposed for each of the pixels in the present example embodiment.

According to the method described referring to FIGS. 4A to 4C, the hole transport layer HTL and the organic light emitting layer EML may be formed. In addition, as additionally explained referring to FIG. 4B, a light may be provided to, for example, the whole donor substrate 100 to form the hole injection layer HIL and the electron injection layer EIL.

Having described example embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A donor substrate comprising:
a base layer;
a light-to-heat conversion layer disposed on the base layer;
a buffer layer disposed on the light-to-heat conversion layer, the buffer layer including a cross-linked polymer, a spacer polymer bonded to the cross-linked polymer, and a perfluoroalkyl alcohol group bonded to the spacer polymer; and
a transfer layer disposed on the buffer layer,
wherein a surface of the buffer layer has hydrophobic properties, and
wherein the transfer layer is attached to the surface having hydrophobic properties.

2. The donor substrate of claim 1,
wherein the spacer polymer has a following Chemical Formula 2,

[Chemical Formula 2]

wherein in the Chemical Formula, y is 1 to 10.

3. The donor substrate of claim 2,
wherein a number of carbon atoms bonding with fluorine in the perfluoroalkyl alcohol group is 3 to 20.

4. The donor substrate of claim 2,
wherein the perfluoroalkyl alcohol group is 2-(perfluorooctyl)ethanol.

5. A method for forming a transfer pattern, comprising:
disposing a donor substrate comprising a base layer, a light-to-heat conversion layer disposed on the base layer, a buffer layer disposed on the light-to-heat conversion layer and including a cross-linked polymer, a spacer polymer bonded to the cross-linked polymer, and a perfluoroalkyl alcohol group bonded to the spacer polymer, and a transfer layer disposed on the buffer layer, on a transcription substrate to make a contact between the transfer layer and the transcription substrate, wherein a surface of the buffer layer has hydrophobic properties, and the transfer layer attached to the surface having hydrophobic properties;
exposing the donor substrate to transfer the transfer pattern onto the transcription substrate; and
removing the donor substrate from the transcription substrate.

6. The method for forming a transfer pattern of claim 5,
wherein the spacer polymer has a following Chemical Formula 2,

[Chemical Formula 2]

wherein in the Chemical Formula, y is 1 to 10.

7. The method for forming a transfer pattern of claim 5,
wherein the transcription substrate constitutes a portion of an organic light emitting display substrate.

8. The method for forming a transfer pattern of claim 7,
wherein the organic light emitting display substrate includes an organic light emitting device, and the transfer pattern constitutes a portion of the organic light emitting device.

9. The method for forming a transfer pattern of claim 5,
wherein a number of carbon atoms bonding with fluorine in the perfluoroalkyl alcohol group is 3 to 20.

10. The method for forming a transfer pattern of claim 9,
wherein the perfluoroalkyl alcohol group is 2-(perfluorooctyl)ethanol.

11. The method of claim 5,
wherein the exposing of the donor substrate comprises exposing the donor substrate to a light to transfer the transfer pattern onto the base substrate.

12. The method of claim 11,
wherein the light comprises one of ultraviolet light or visible light.

13. The method of claim 11,
wherein the light comprises a laser beam having a constant wavelength.

14. The method of claim 11,
wherein only a portion of the donor substrate is exposed to the light.

15. The method of claim 11,
wherein substantially the entire donor substrate is exposed to the light.

16. A method for forming a transfer pattern on an organic light emitting display substrate, comprising:
disposing a donor substrate comprising a base layer, a light-to-heat conversion layer disposed on the base layer, a buffer layer disposed on the light-to-heat conversion layer and including a cross-linked polymer, a spacer polymer bonded to the cross-linked polymer, and a perfluoroalkyl alcohol group bonded to the spacer polymer, and a transfer layer disposed on the buffer layer, on a base substrate of the organic light emitting display substrate to make a contact between the transfer layer and the base substrate, wherein a surface of the buffer layer has hydrophobic properties and the transfer layer is attached to the surface having hydrophobic properties;
exposing the donor substrate to light to transfer the transfer pattern onto the base substrate, wherein the organic light emitting display substrate includes an organic light emitting device, and wherein the transfer pattern constitutes at least a portion of the organic light emitting device and includes at least one of a hole transporting layer, an organic light emitting layer, a hole injection layer and an electron injection layer; and
removing the donor substrate from the base substrate after forming the transfer pattern.

17. The method for forming a transfer pattern on an organic light emitting display substrate of claim 16,
wherein only a portion of the donor substrate is exposed to the light and wherein the transfer pattern transferred onto the base substrate of the organic light emitting display substrate includes the hole transporting layer disposed on the base substrate and the organic light emitting layer disposed on the hole transporting layer.

18. The method for forming a transfer pattern on an organic light emitting display substrate of claim 16, wherein substantially the entire donor substrate is exposed to the light and wherein the transfer pattern transferred onto the base substrate of the organic light emitting display substrate includes the hole injection layer disposed on the base substrate, the hole transporting layer disposed on the hole injection layer, the organic light emitting layer disposed on the hole transporting layer and the electron injection layer disposed on the organic light emitting layer.

* * * * *